United States Patent
Uchida

(10) Patent No.: US 8,048,260 B2
(45) Date of Patent: Nov. 1, 2011

(54) MAGNETIC NEUTRAL LINE DISCHARGE PLASMA PROCESSING SYSTEM

(75) Inventor: Taijiro Uchida, Fujisawa (JP)

(73) Assignee: ULVAC, Inc., Kanagawa (JP)

( * ) Notice: Subject to any disclaimer, the term of this patent is extended or adjusted under 35 U.S.C. 154(b) by 0 days.

(21) Appl. No.: 10/457,526

(22) Filed: Jun. 10, 2003

(65) Prior Publication Data

US 2003/0230386 A1    Dec. 18, 2003

(30) Foreign Application Priority Data

Jun. 12, 2002   (JP) ................................. 2002-172019

(51) Int. Cl.
*C23C 16/00*   (2006.01)
*H01L 21/306*   (2006.01)

(52) U.S. Cl. ............................... 156/345.47; 118/723 E

(58) Field of Classification Search ................ 118/723 I, 118/723 IR, 723 AN, 723 E, 723 ER; 156/345.48, 156/345.49, 345.47
See application file for complete search history.

(56) References Cited

U.S. PATENT DOCUMENTS

| | | | | |
|---|---|---|---|---|
| 4,838,978 A | * | 6/1989 | Sekine et al. ............ | 156/345.46 |
| 4,963,242 A | * | 10/1990 | Sato et al. ................ | 204/298.31 |
| 5,272,417 A | * | 12/1993 | Ohmi ........................ | 315/111.21 |
| 5,527,394 A | * | 6/1996 | Heinrich et al. .......... | 118/723 E |
| 5,571,366 A | * | 11/1996 | Ishii et al. ................. | 156/345.26 |
| 5,690,781 A | * | 11/1997 | Yoshida et al. ........... | 156/345.48 |
| 5,733,405 A | * | 3/1998 | Taki et al. ................. | 156/345.46 |
| 5,897,712 A | * | 4/1999 | Hanawa et al. ................... | 216/68 |
| 5,965,034 A | * | 10/1999 | Vinogradov et al. ........... | 216/68 |
| 6,028,395 A | * | 2/2000 | Holland et al. ............ | 315/111.51 |
| 6,077,384 A | * | 6/2000 | Collins et al. ............ | 156/345.29 |
| 6,155,199 A | * | 12/2000 | Chen et al. ................ | 118/723 I |
| 6,268,700 B1 | * | 7/2001 | Holland et al. ........... | 315/111.51 |
| 6,320,320 B1 | * | 11/2001 | Bailey et al. ............. | 315/111.51 |
| 2003/0168172 A1 | * | 9/2003 | Glukhoy .................. | 156/345.28 |

FOREIGN PATENT DOCUMENTS

JP    2705897    9/1997
JP    3177573    4/2001

* cited by examiner

*Primary Examiner* — Luz L. Alejandro
(74) *Attorney, Agent, or Firm* — Stites & Harbison PLLC; Jeffrey A. Haeberlin

(57) ABSTRACT

The present invention provides a magnetic neutral line discharge plasma processing system that can apply a plurality of linear magnetic neutral line discharge plasmas simultaneously so as to uniformly process all the surface area of a large rectangular substrate for homogeneousness. The management field generating means of the magnetic neutral line discharge plasma processing system has at least two linear current rods arranged outside the vacuum chamber in parallel with the surface to be processed of the object of processing in the vacuum chamber so as to form at least a linear magnetic neutral line in the vacuum chamber between adjacently located linear current rods.

5 Claims, 5 Drawing Sheets

MAGNETIC NEUTRAL LINE DISCHARGE PLASMA PROCESSING SYSTEM

BACKGROUND OF THE INVENTION

1. Field of the Invention

The present invention relates to a discharge plasma processing system for performing a processing operation such as etching, sputtering, coating and CVD on an object such as substrate or target by utilizing plasma.

2. Related Background Art

Magnetic neutral line discharge plasma systems have been proposed in Japanese Patents Nos. 2705897 and 3177573. The effectiveness of such systems has been verified and their industrial merits have been acknowledged. The magnetic neutral line discharge (also referred to as NLD for abbreviation) plasma has two major features that other plasma systems do not have.

One of the features is that it provides time/space controllability relative to the size and the location of plasma to be generated. In other words, both the size and the location of required plasma can be changed in terms of both time and space. This is because a magnetic neutral line discharge plasma can be generated in a vacuum chamber without difficulty by controlling outside and the plasma can be generated along the profile of the magnetic neutral line. This type of freedom is not found in any other systems.

The other feature is that the NLD plasma does not involve higher temperature component that is not necessary for surface treatments and a high density plasma can be produced under a low gas pressure supply, comparing with any other plasma production method.

These features come from so-called a chaotic phenomenon of electrons generated and located around a magnetic neutral line due to meandering motions crossing the neutral line when an RF electric field is applied to the neutral line.

Electrons to be generated around the neutral line are well heated and thermalized so chaotically that result in rise up of electron density itself rather than increase of temperature under ordinary RF electric field application.

Higher density electrons of lower temperature make easier transfer of electron energy to neutrals and ions so that a lower temperature and higher density plasma can be generated under lower pressure gas supply. This leads us such plasma is useful for damage-less and high through put operation of surface processing. Due to the two features, magnetic neutral line discharge plasma processing systems are performing remarkably well in the field of ultra-micro processing that increasingly requires high processing precisions such as glass processing for micro-lenses and optical waveguides and etching of low dielectric materials.

FIG. 1 of the accompanying drawings is a conceptual illustration of an inductive electric field type magnetic neutral line discharge plasma processing system manufactured for the purpose of processing the surface of a disk-shaped substrate. Such systems have been manufactured to date.

Referring to FIG. 1, the illustrated system comprises a cylindrical vacuum chamber A and three coils that includes an upper coil B, a middle coil C and a lower coil D that are arranged coaxially outside the vacuum chamber A. A circular magnetic neutral line E is produced in the cylindrical vacuum chamber A by regulating currents made to flow to three coils B, C and D. Plasma is generated in the form of a doughnut having a core of circular magnetic neutral line E by applying an inductive electric field directed to the azimuth that is excited with an RF coil G. This RF coil G is wound outside an insulating cylindrical vacuum wall F typically made of ceramic. For this process, the diameter and the vertical position of the doughnut-like plasma can be freely controlled by the combination of the electric currents made to flow to the coils B, C and D even during the processing operation.

As pointed out above, high density and low temperature plasma can be generated by using low pressure gas in a magnetic neutral line discharge plasma processing system and this feature is very advantageous when it is exploited for various processing operations. Thus, there is a strong demand for improved magnetic neutral line discharge plasma processing systems that have characteristic features that are not found in any other type systems.

Meanwhile, there is also a strong demand for systems of the type under consideration that can uniformly process all the surface of a large substrate having a length and a width that are as long as about 1 meter. Additionally, the dimensions of the substrate to be processed are increasing almost day by day. When a closed and curved magnetic neutral line having a profile same as the surface area of an object of processing, which may typically be a squire or rectangular substrate, is formed by means of a three coil arrangement, using a conventional magnetic neutral line discharge plasma processing system as shown in FIG. 1 and the area of the magnetic neutral line is reduced or enlarged over the entire surface of the large substrate by controlling the electric current flowing to the middle coil, the magnetic gradients along the directions of the four sides that surround the magnetic neutral line can change remarkably to consequently damage the features of the NLD system and, at the same time, it is necessary to provide a voltage at the power source side that is as high as the voltage necessary for applying an electric field to the periphery of the substrate multiplied by the length of the entire periphery in order to induce the electric field along the periphery of the substrate. Therefore preparing a system of the type under consideration is required to avoid this problem.

Additionally, with the arrangement of the conventional magnetic neutral line discharge plasma processing system of FIG. 1, the coil for generating an electric field that is to be applied along the magnetic neutral line generated in the vacuum chamber and some related components are disposed outside the vacuum chamber and therefore the corresponding part of the wall of the vacuum chamber needs to be made of an insulating material such as ceramic that can firmly withstand a vacuum condition. However, if the inner wall surface that is located at the vacuum side is made very smooth, some measures need to be taken to eliminate or prevent adsorption attributable to affinity for gas of a special type but such a wall made of such an insulating material is costly to raise the overall cost of the system itself. This problem is aggravated when the system is large.

Furthermore, in a magnetic neutral line discharge plasma processing system of the type under consideration, the magnetic field generating means for generating a magnetic neutral line formed by a succession of zero magnetic field positions existing wound outside the vacuum chamber F typically made of ceramic. Therefore, if the system is to be used for processing a large square or rectangular substrate, the space necessary for installing the magnetic field generating means becomes inevitably large and hence it is desired to be located at an easily accessible position for the substrate and have a simplified configuration from the viewpoint of assembling and servicing the system.

SUMMARY OF THE INVENTION

In view of the above identified circumstances, it is therefore an object of the present invention to provide a magnetic neutral line discharge plasma processing system that can apply a plurality of linear magnetic neutral line discharge plasmas simultaneously so as to uniformly process all the surface area of a large rectangular substrate for homogeneousness.

Another object of the present invention is to provide a magnetic neutral line discharge plasma processing system that can apply a plurality of linear magnetic neutral line discharge plasmas simultaneously so as to uniformly process all the surface area of a large rectangular substrate for homogeneousness and, at the same time, comprises a magnetic field generating means that is located at an easily accessible position and has a simplified configuration from the viewpoint of assembling and servicing the system.

Still another object of the present invention is to provide a magnetic neutral line discharge plasma processing system that can apply a plurality of linear magnetic neutral line discharge plasmas simultaneously so as to uniformly process all the surface area of a large rectangular substrate for homogeneousness and, at the same time, comprises an electric field generating means that does not requires the use of a costly insulating material such as ceramic for the vacuum chamber wall so that the system may become available at relatively low cost.

According to the present invention, the above objects are achieved by providing a discharge plasma processing system comprising a magnetic field generating means for generating magnetic neutral lines formed by a succession of zero magnetic field positions existing continuously in a vacuum chamber and an electric field generating means for generating discharge plasmas in a space containing the magnetic neutral lines by applying a radio frequency electric field to the magnetic neutral lines generated in the vacuum chamber so as to process an object in the vacuum chamber by utilizing plasma, said management field generating means having at least two linear current rods arranged outside the vacuum chamber in parallel with the surface to be processed of the object of processing in the vacuum chamber so as to form at least one linear magnetic neutral line in the vacuum chamber between adjacently located linear current rods.

Preferably, the linear current rods of the magnetic field generating means may be arranged as a pair with the object of processing interposed between them. Preferably, the paired linear current rods are arranged in juxtaposition and in parallel with each other so as to form linear magnetic neutral lines running in parallel with them at a position located between them in the vacuum chamber by causing constant currents to run respectively through them, said constant currents being either DCs or ACs having a same phase. Alternatively, a plurality of pairs of linear current rods may be arranged in parallel with one of the sides of a rectangular plane with the rectangular plane interposed between them so as to form a plurality of linear magnetic neutral lines running in parallel with said side of the rectangular plane and disposed on the rectangular plane defined in the vacuum chamber and electric currents running in a same direction are caused to run through each pair of linear current rods. The electric currents running through a pair of current rods are caused to flow in a direction opposite to the direction of the electric currents running through an adjacently disposed pair of current rods arranged in parallel with one of the sides of the rectangular plane on the rectangular plane defined in the vacuum chamber with the rectangular plane interposed between them.

Preferably, the linear current rods of the magnetic field generating means may be arranged in parallel with the surface to be treated of the object of processing. The linear current rods may be arranged in parallel with each other and the linear magnetic neutral line formed at a position in parallel with and between adjacently located linear current rods in the vacuum chamber may be controlled by causing oppositely directed electric currents to flow through the adjacently located linear current rods. Alternatively, a plurality of linear current rods may be arranged in parallel with one of the sides of the rectangular plane so as to form a plurality of linear magnetic neutral lines on the rectangular plane defined in the vacuum chamber in parallel with the side and the position of the plane formed by the plurality of linear magnetic neutral lines may be controlled by causing electric currents having a same current value to flow through adjacently disposed linear current rods in opposite directions.

Preferably, the linear current rods of the magnetic field generating means may be made movable along the vacuum chamber so as to form planar magnetic neutral line discharge plasma by displacing a plurality of parallel linear magnetic neutral lines in parallel.

Preferably, the electric field generating means may include at least a pair of electrodes arranged in the vacuum chamber with a linear magnetic neutral line interposed between them and adapted to apply a radio frequency variable potential. Each of said pair of electrodes may be formed by a plurality of strip-shaped electrodes or a flat plate-shaped electrode.

With the above described arrangement that the electric field generating means is made to include at least a pair of electrodes arranged in the vacuum chamber with a linear magnetic neutral line interposed between them and adapted to apply a radio frequency variable potential. The applied radio frequency electric field is not directed in parallel with the formed magnetic neutral line but directed in transverse to the magnetic neutral line and a radio frequency electric field is applied between the electrodes. This mode of applying an electric field is referred to as "capacitive electric field type" in this specification.

DESCRIPTION OF THE PREFERRED EMBODIMENTS

Now, the present invention will be described in greater detail by referring to FIGS. 2 through 6 of the accompanying drawings that illustrate preferred embodiments of the invention.

Figure 1:
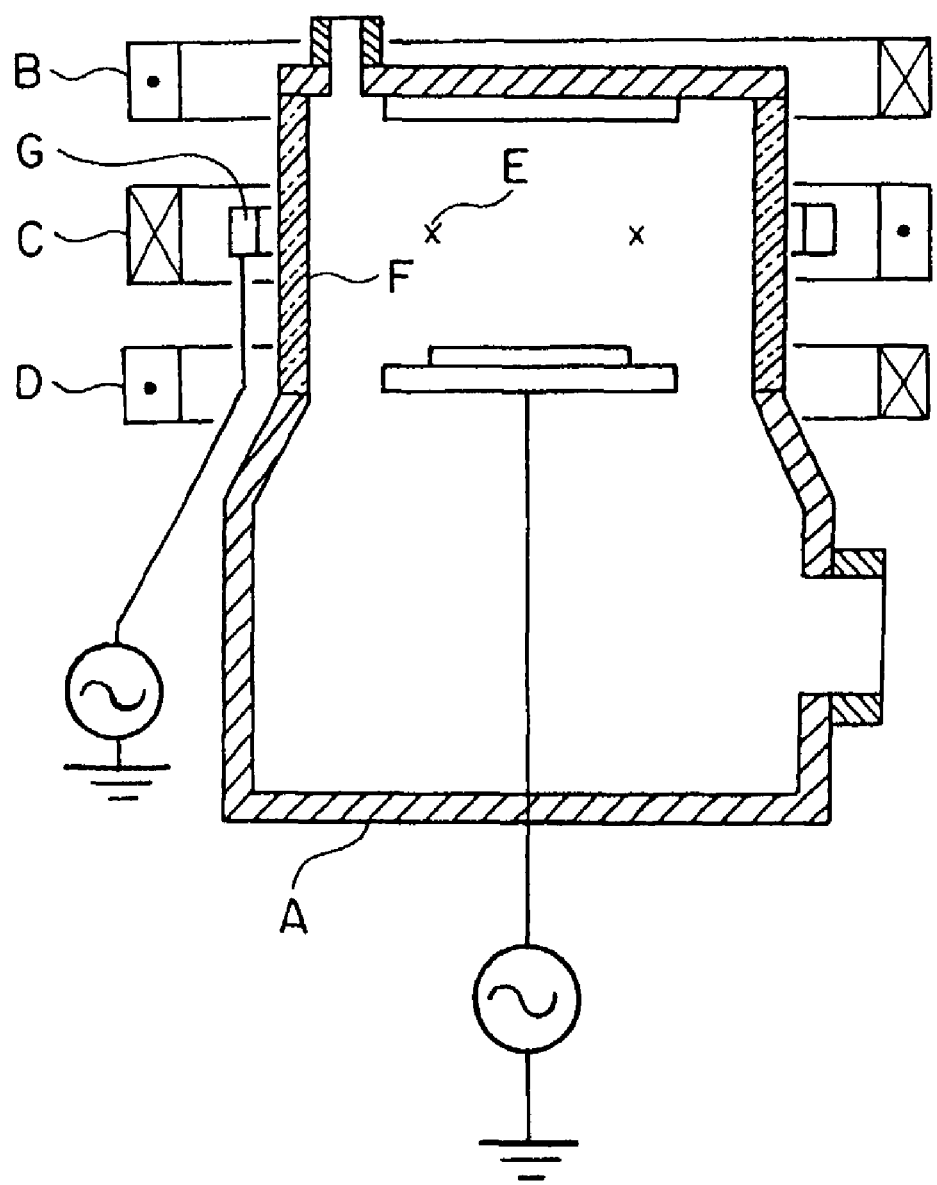
FIG. 1 is a schematic longitudinal cross sectional view of a conventional inductive electric field type circular magnetic neutral line discharge plasma processing system.
Figure 2:
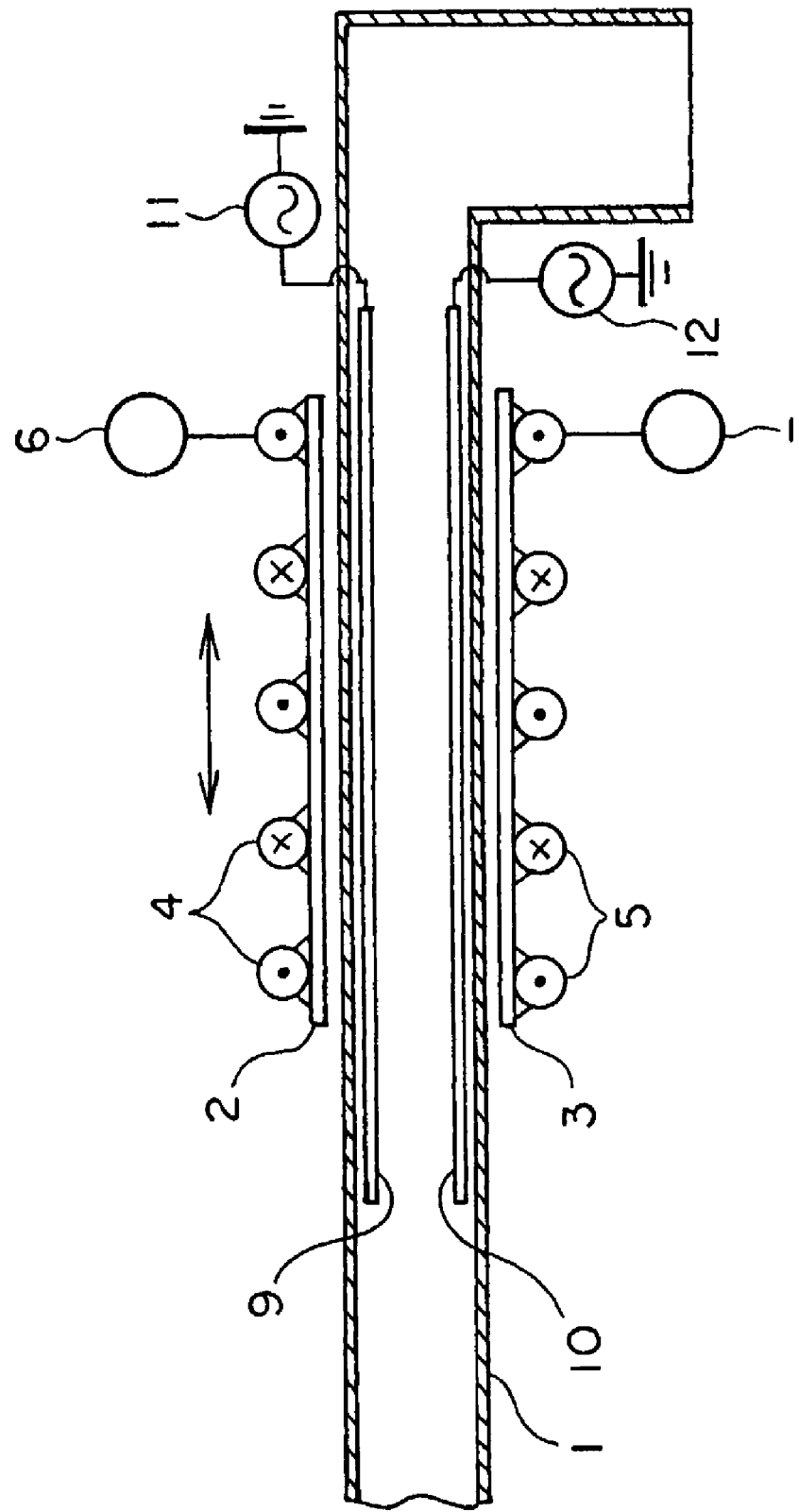
FIG. 2 is a schematic longitudinal cross sectional view of an embodiment of magnetic neutral line discharge plasma processing system according to the present invention, illustrating its configuration.

FIG. 2 is a schematic longitudinal cross sectional view of an embodiment of magnetic neutral line discharge plasma processing system according to the present invention, illustrating its configuration. Referring to FIG. 2, the illustrated system comprises a flat and substantially box-shaped vacuum chamber 1 made of metal and having a size that is large enough for containing a large rectangular substrate. The vacuum chamber 1 is connected to a vacuum exhaust system (not shown). The vacuum chamber 1 is mounted on some other component of the system.

Figure 3:
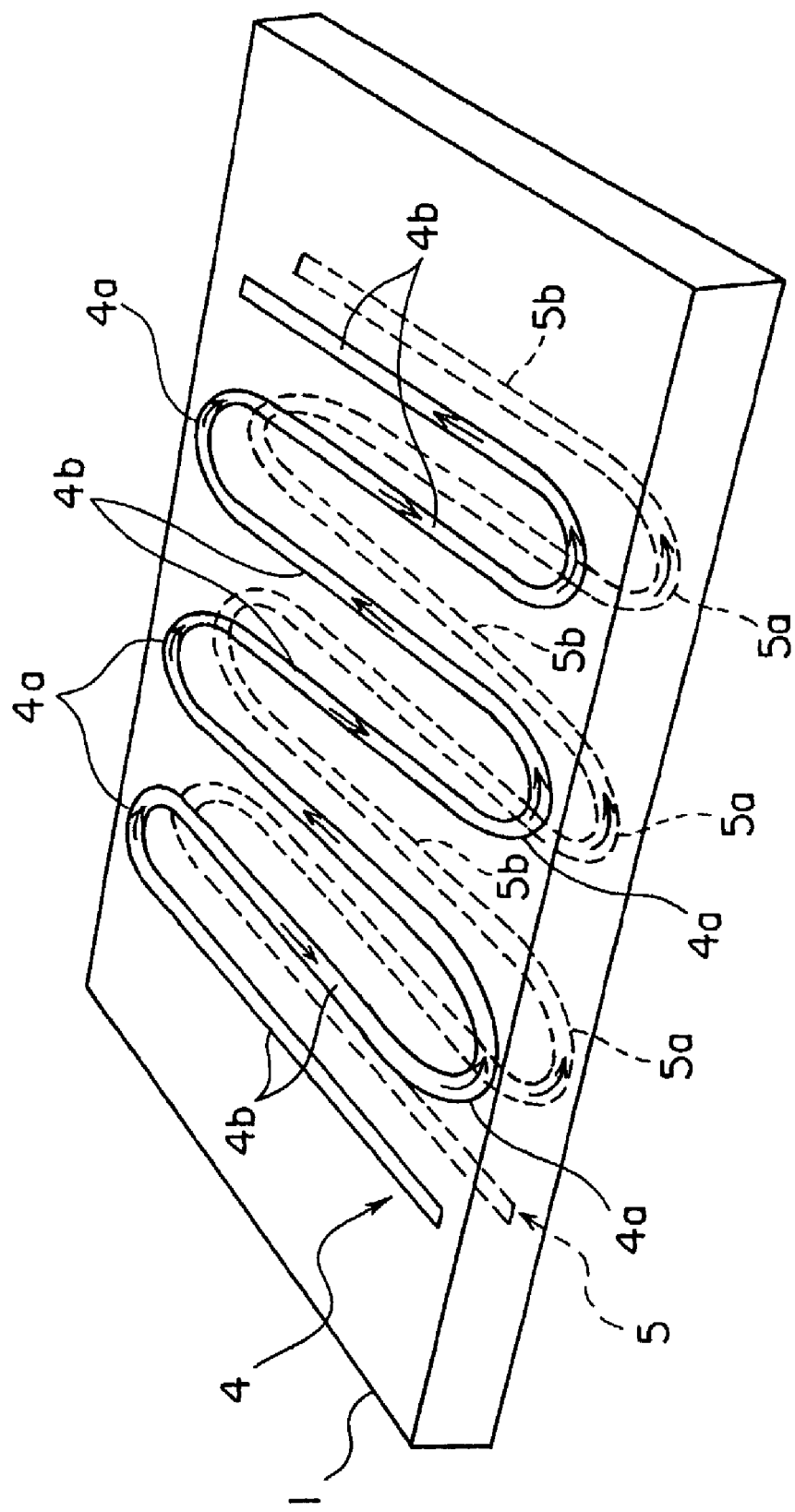
FIG. 3 is a schematic perspective view of a magnetic field generating means formed by a pair of linear current rods that can be used for the magnetic neutral line discharge plasma processing system of FIG. 2.
Figure 4:
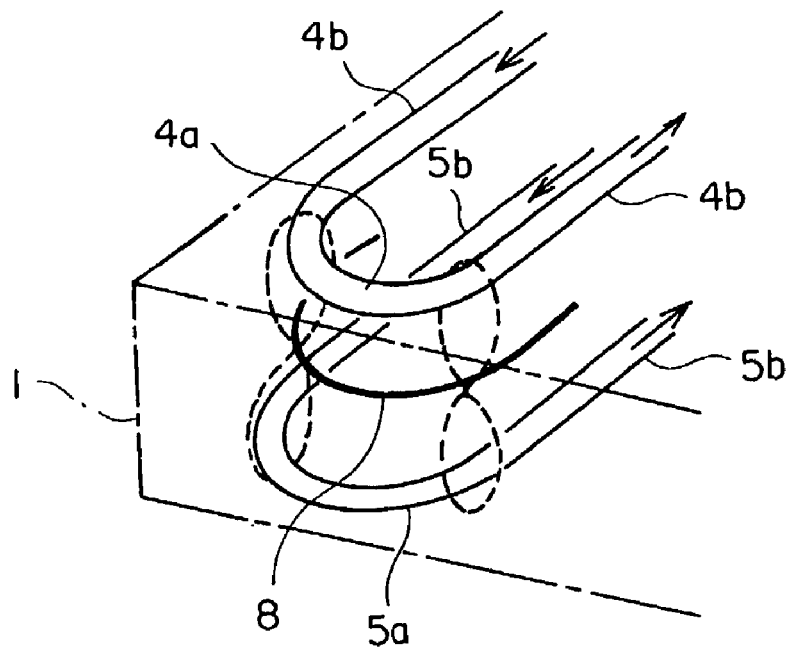
FIG. 4 is a schematic partial perspective view of the pair of linear current rods of the magnetic field generating means of FIG. 2, illustrating that adjacent neutral lines are lined with each other at an end of the pair of linear current rods.

Plate-shaped movable support plates 2, 3 are arranged outside the vacuum chamber 1 respectively above and below the latter and provided with respective current rods 4, 5. The current rods 4, 5 are bent so as to run in parallel with one of the sides of the vacuum chamber 1 substantially at regular intervals as conceptually illustrated in FIG. 3. In the instance of FIG. 2, the side in parallel with which the current rods 4, 5 run is one of the short sides of the vacuum chamber 1. In FIG. 3, there are shown a pair of adjacently located bent sections 4a, 5a and two pairs of linear sections 4b, 5b extending respectively from the bent sections 4a, 5a. The current rods 4, 5 are connected to respective constant current sources 6, 7. With this arrangement, only two constant current sources including an upper current source and a lower current source are provided for the magnetic field generating means to make the configuration of the entire system very simple so as to allow the system to maximally exploit the available space.

Electric currents are caused to run from the constant current sources 6, 7 to the respective current rods 4, 5 in a same direction. In other words, electric currents are caused to run respectively to the linear sections 4b, 5b of the paired current rods. As a result, a linear magnetic neutral line 8 is formed between each pair of linear sections 4b, 5b of the current rods in the vacuum chamber 1. Thus, linear magnetic neutral lines 8 as many as the number of pairs of linear sections 4b, 5b of the current rods 4, 5 are formed in the vacuum chamber 1. Since the upper and lower sections of the current rods are connected respective to the adjacent liner sections at the opposite ends thereof, the corresponding magnetic neutral line 8 is also connected to the adjacent magnetic neutral lines. Therefore, the discharge plasma generated in a region of any two adjacently located magnetic neutral lines 8 are averaged and unified in areas located at the ends thereof and their vicinities.

While the electric currents are made to flow to each pair of current rods in a same direction, the position of the magnetic neutral line formed between them can be displaced upwardly or downwardly by changing the intensities of the electric currents that are made to flow respectively to the upper and lower current rods 4, 5. Additionally, the positions of the plurality of magnetic neutral lines can be vertically controlled simultaneously to a same extend by changing the ratio of the intensities of the electric currents that are made to flow respectively to the upper and lower current rods 4, 5.

Figure 5:
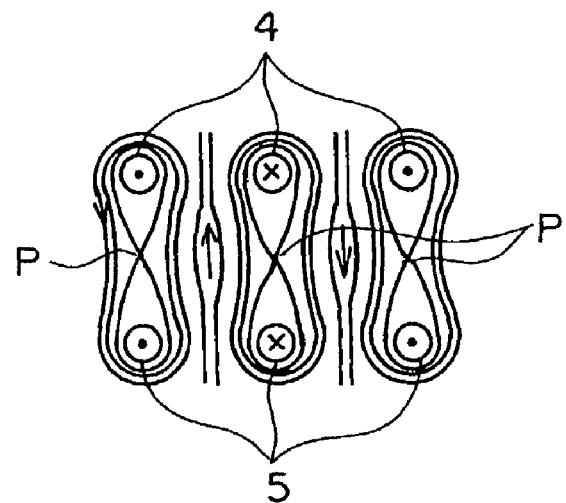
FIG. 5 is a schematic illustration of lines of magnetic force shown as vertical cross section relative to the plurality of pairs of linear current rods of the magnetic field generating means and the generated magnetic neutral lines.

FIG. 5 is a schematic illustration of lines of magnetic force observable near three adjacently located magnetic neutral lines shown as vertical cross section taken arbitrarily relative to a plurality of pairs of linear sections 4b, 5b of the current rods 4, 5 of the magnetic field generating means that generate the magnetic neutral lines. In FIG. 5, each point P is a position where four lines of magnetic force are put together (which is referred to as separatrix). Additionally fluxes of lines of magnetic force that are directed alternately upward and downward and located between two adjacent magnetic neutral points P are shown. These fluxes of lines of magnetic force are produced when the electric currents that are made to flow respectively to adjacently located paired sections of the current rods are inversely directed. With this arrangement, the relative positions of the magnetic neutral lines are made stable and fixed due to their magnetic pressure.

Referring back to FIG. 2, a pair of rectangular plate-shaped electrodes 9, 10 are arranged in the vacuum chamber 1 with the plurality of magnetic neutral lines interposed between them. These magnetic neutral lines are formed in parallel with the short sides of the rectangle of the vacuum chamber 1 by the paired sections 4b, 5b of the current rods 4, 5. The rectangular plate-shaped electrodes 9, 10 are connected to respective radio frequency power sources 11, 12. As radio frequency power is applied to the pair of rectangular plate-shaped electrodes 9, 10 from the respective radio frequency power sources 11, 12, the rectangular plate-shaped electrodes 9, 10 applies a radio frequency electric field to each of the magnetic neutral lines 8 so that capacitive electric field type magnetic neutral line discharge plasmas are generated in parallel with and along the magnetic neutral lines.

Meanwhile, when a plurality of linear magnetic neutral line discharge plasmas are generated simultaneously in order to process a large rectangular substrate, the processing effect can be differentiated between a position located between two adjacent magnetic neutral lines and a position located immediately below a magnetic neutral line. In view of this problem, in the case of the illustrated embodiment, the paired electrodes 9, 10 that sandwich the magnetic neutral lines are plate-shaped so that the relative position of the substrate and a magnetic neutral line may be displaced to the next magnetic neutral line stepwise or continuously in order to boost the averaging or uniformizing effect.

While continuous current rods 4, 5 are bent to produce pairs of linear sections 4b, 5b in the case of the embodiment illustrated in FIGS. 2 through 5, pairs of linear current rods 4b, 5b may alternatively be provided and any two adjacently located current rods 4b or 5b may be connected at corresponding ends thereof. Additionally, while the linear sections 4b, 5b of the current rods 4, 5 are arranged in parallel with a short side of the vacuum chamber 1 in the instance of the illustrated embodiment, they may alternatively be so arranged as to be in parallel with a long side of the vacuum chamber 1 depending on the application of the system and hence the involved processing technique.

Furthermore, while the electrodes arranged in the vacuum chamber 1 in order to apply a radio frequency electric field are plate-shaped in the instance of the illustrated instance, each of them may be replaced by a plurality of strip-shaped electrodes arranged in parallel with the magnetic neutral lines depending on the application of the system and hence the involved processing technique.

Figure 6:
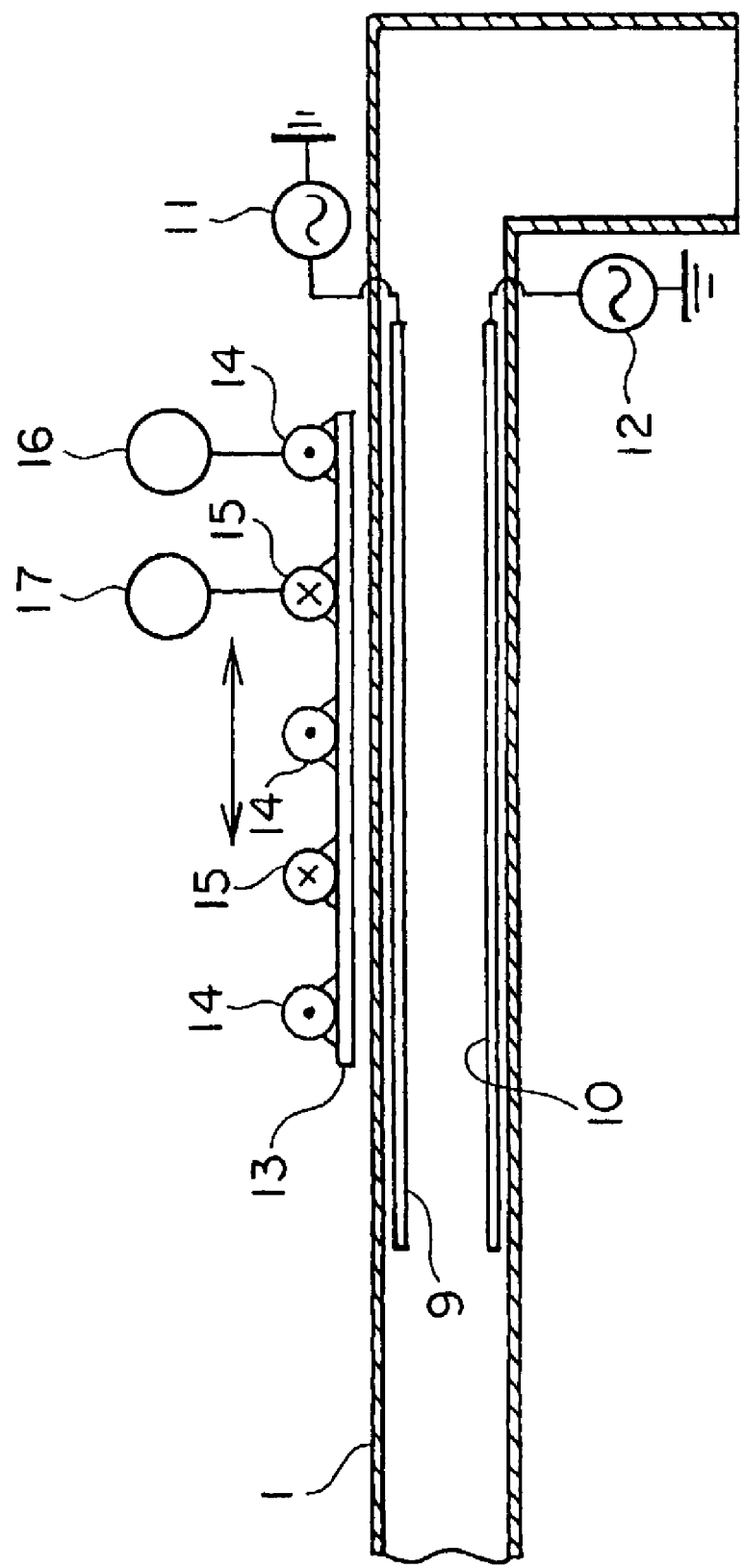
FIG. 6 is a schematic longitudinal cross sectional view of another embodiment of magnetic neutral line discharge plasma processing system according to the present invention, illustrating its configuration.

FIG. 6 is a schematic longitudinal cross sectional view of another embodiment of magnetic neutral line discharge plasma processing system according to the present invention, illustrating its configuration. In this embodiment, the magnetic neutral line generating means is arranged only above the vacuum chamber 1. More specifically, current rods 14, 15 are arranged on a movable plate-shaped support member 13 arranged above the upper outer surface of the vacuum chamber 1. Additionally, the linear sections of the current rods 14, 15 are arranged substantially at regular intervals in parallel with a short side of the vacuum chamber 1 above the upper outer surface of the latter in such a way that any two adjacently located linear sections are juxtaposed relative to each other. The current rods 14, 15 are connected to respective constant current sources 16, 17. Otherwise, the configuration of this embodiment is substantially identical with that of the embodiment of FIG. 2 and may be modified or altered in a manner as described above by referring to the first embodiment.

The linear sections of the current rods of the magnetic field generating means are arranged in parallel with each other. The positions of the linear magnetic neutral lines, each of which is formed in parallel with and between two adjacently located linear sections of the current rods in the vacuum chamber 1, can be controlled by causing inversely directed electric currents to flow respectively through any two adjacently disposed linear sections of the current rods. Additionally, the position of the plane defined by the plurality of linear magnetic neutral lines can be controlled by causing inversely directed electric currents having a same intensity to flow respectively through any two adjacently disposed linear sections of the current rods.

As described above in detail, the present invention provides a discharge plasma processing system comprising a magnetic field generating means for generating magnetic neutral lines formed by a succession of zero magnetic field positions existing continuously in the vacuum chamber and an electric field generating means for generating discharge plasmas in a space containing the magnetic neutral lines by applying a radio frequency electric field to the magnetic neutral lines generated in the vacuum chamber so as to process an object in the vacuum chamber by utilizing plasma, the management field generating means having at least two linear current rods arranged outside the vacuum chamber in parallel with the surface to be processed of the object of processing in the vacuum chamber so as to form at least a linear magnetic neutral line in the vacuum chamber between adjacently located linear current rods. With this arrangement, the substrate to be processed can be processed homogeneously regardless of the size and the shape of the substrate to be processed.

When the paired linear current rods of the magnetic field generating means are arranged in juxtaposition and in parallel with each other on the surface to be processed of the object of processing, the entire area of the large substrate can be processed homogeneously and the system can be assembled and serviced with ease. Such a supply can be designed simply and easily.

When the electric field generating means includes at least a pair of electrodes arranged in the vacuum chamber with a linear magnetic neutral line interposed between them and adapted to apply a radio frequency variable potential, it is no longer necessary to use a costly insulating material such as ceramic for the wall of the vacuum chamber so that it is possible to provide a magnetic neutral line discharge plasma processing system adapted to process a substrate having a large area at relatively low cost.

The invention claimed is:

1. A magnetic neutral line discharge plasma processing system, comprising:
    a rectangular vacuum chamber defining a rectangular plane therein in which a rectangular substrate having a surface to be processed is located at the rectangular plane;
    a magnetic field generating means generating magnetic neutral lines formed by a succession of zero magnetic field positions existing continuously in the vacuum chamber along the rectangular plane; and
    an electric field generating means generating discharge plasma in a space containing the magnetic neutral lines by applying a radio frequency electric field to the magnetic neutral lines generated in the rectangular vacuum chamber at the rectangular plane;
    the magnetic field generating means including at least two current rods each of which includes a plurality of parallel linear sections adjacently positioned and a plurality of bent sections, the bent sections connecting adjacent ends of two of the linear sections the bent sections located at opposite sides so as to form a continuous sinuous current path extending over an entire area of the rectangular plane;
    the at least two current rods located parallel with each other and with the rectangular plane, and connected to respective constant current sources;
    the electric field generating means including at least one pair of electrodes extending in parallel with the magnetic neutral lines, respectively located on opposite side of the rectangular plane, and arranged in the vacuum chamber so that the rectangular substrate and the magnetic neutral lines are interposed between the at least one pair of electrodes, the at least one pair of electrodes supplied with a radio frequency variable potential thereby generating plasma along the magnetic neutral lines.

2. The magnetic neutral line discharge plasma processing system of claim 1, wherein the at least two current rods are arranged outside the vacuum chamber and are respectively located on opposite sides of the rectangular plane so that the rectangular substrate is interposed between the at least two current rods.

3. The magnetic neutral line discharge plasma processing system of claim 1, wherein the at least two current rods carry respective constant currents in a same direction.

4. The magnetic neutral line discharge plasma processing system of claim 1, wherein the at least two current rods generate the magnetic neutral lines in the vacuum chamber located between the at least two current rods.

5. The magnetic neutral line discharge plasma processing system of claim 1, wherein the at least two current rods are placed on respective plate shaped movable support plates.

* * * * *